United States Patent
Cheng et al.

(10) Patent No.: US 9,991,092 B2
(45) Date of Patent: Jun. 5, 2018

(54) SCANNING ELECTRON MICROSCOPE AND SAMPLE OBSERVATION METHOD

(75) Inventors: Zhaohui Cheng, Tokyo (JP); Hikaru Koyama, Kodaira (JP); Yoshinobu Kimura, Tokyo (JP); Hiroyuki Shinada, Mitaka (JP); Osamu Komuro, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days. days.

(21) Appl. No.: 13/387,183

(22) PCT Filed: Jul. 30, 2010

(86) PCT No.: PCT/JP2010/004843
§ 371 (c)(1),
(2), (4) Date: Mar. 1, 2012

(87) PCT Pub. No.: WO2011/016208
PCT Pub. Date: Feb. 10, 2011

(65) Prior Publication Data
US 2012/0153145 A1    Jun. 21, 2012

(30) Foreign Application Priority Data

Aug. 7, 2009 (JP) .................................. 2009-184001
Oct. 21, 2009 (JP) .................................. 2009-241966

(51) Int. Cl.
*G01N 23/00* (2006.01)
*H01J 37/28* (2006.01)

(52) U.S. Cl.
CPC ....... *H01J 37/28* (2013.01); *H01J 2237/2803* (2013.01)

(58) Field of Classification Search
None
See application file for complete search history.

(56) References Cited

U.S. PATENT DOCUMENTS 4,736,110 A * 4/1988 Awamura ............. G02B 21/002
250/201.4
5,149,976 A * 9/1992 Sipma ................. H01J 37/3023
250/396 R (Continued)

FOREIGN PATENT DOCUMENTS

JP    61-290640 A    12/1986
JP    62-52841 A     3/1987

(Continued)

OTHER PUBLICATIONS

Japanese Office Action received in Japanese Application No. 2011-525776 dated Dec. 3, 2013.

*Primary Examiner* — Andrew Smyth
(74) *Attorney, Agent, or Firm* — Mattingly & Malur, PC

(57) ABSTRACT

A scanning electron microscope of the present invention performs scanning by changing a scanning line density in accordance with a sample when an image of a scanned region is formed by scanning a two-dimensional region on the sample with an electron beam or is provided with a GUI having sample information input means which inputs information relating to the sample and display means which displays a recommended scanning conditioHn according to the input and performs scanning with a scanning line density according to the sample by selecting the recommended scanning condition. As a result, in observation using a scanning electron microscope, a suitable scanning device which can improve contrast of a profile of a two-dimensional pattern and suppress shading by suppressing the influence of charging caused by primary charged particle radiation and by improving a detection rate of secondary electrons and a scanning method are provided.

37 Claims, 13 Drawing Sheets

(a)

(b)

(56) References Cited

U.S. PATENT DOCUMENTS

| | | | |
|---|---|---|---|
| 5,869,833 A | 2/1999 | Richardson et al. | |
| 6,038,018 A * | 3/2000 | Yamazaki | H01J 37/28 356/237.1 |
| 6,414,308 B1 * | 7/2002 | Bowley, Jr. | H01J 37/222 250/307 |
| 6,563,114 B1 * | 5/2003 | Nagahama | G01R 31/307 250/306 |
| 6,710,342 B1 | 3/2004 | Jau et al. | |
| 6,879,719 B1 | 4/2005 | Conrad et al. | |
| 7,045,782 B2 | 5/2006 | Ikeda et al. | |
| 7,439,503 B2 | 10/2008 | Abe | |
| 7,488,938 B1 | 2/2009 | Gubbens et al. | |
| 7,598,755 B2 * | 10/2009 | Furukawa | G01R 31/307 250/492.2 |
| 7,659,508 B2 * | 2/2010 | Nasu | G01B 15/00 250/307 |
| 7,763,852 B2 | 7/2010 | Ikegami et al. | |
| 2005/0072753 A1 | 4/2005 | Koops | H01J 37/3056 216/2 |
| 2006/0060781 A1 * | 3/2006 | Watanabe | B82Y 10/00 250/310 |
| 2006/0076490 A1 * | 4/2006 | Gunji | G01R 31/305 250/310 |
| 2007/0159662 A1 | 7/2007 | Kobaru et al. | |
| 2007/0181807 A1 * | 8/2007 | Fukuda | H01J 37/263 250/310 |
| 2007/0280559 A1 * | 12/2007 | Ishitani | H01J 37/222 382/299 |
| 2008/0116375 A1 | 5/2008 | Ikegami et al. | |
| 2008/0272299 A1 * | 11/2008 | Jin | G01Q 60/38 250/310 |
| 2009/0135240 A1 * | 5/2009 | Phaneuf | G01N 1/286 347/246 |
| 2009/0218491 A1 * | 9/2009 | Morokuma | G01B 15/04 250/310 |
| 2010/0163727 A1 * | 7/2010 | Bell | G01R 31/307 250/307 |
| 2010/0314539 A1 * | 12/2010 | Xiao | H01L 22/12 250/307 |

FOREIGN PATENT DOCUMENTS

| | | |
|---|---|---|
| JP | 2005-142038 A | 6/2005 |
| JP | 2005-174883 A | 6/2005 |
| JP | 2007-59370 A | 3/2007 |
| JP | 4057653 B2 | 12/2007 |
| JP | 2008-123716 A | 5/2008 |
| WO | WO03/021186 A1 | 3/2003 |

* cited by examiner (a) Resist pattern example  (b) SEM image of two-dimensional pattern  (c) Contour data of (b)

(d) SEM image of two-dimensional pattern  (e) Contour data of (d)

(a)  (b)

SCANNING ELECTRON MICROSCOPE AND SAMPLE OBSERVATION METHOD

TECHNICAL FIELD

The present invention relates to, in a scanning electron microscope which observes a sample by using charged particle radiation, a method in which electrons emitted from the sample by the charged particle radiation are detected/imaged and the shape and composition of the sample are observed on the basis of that and a scanning electron microscope used for that purpose.

BACKGROUND ART

Due to integration of a semiconductor device and narrowing of a process margin involved in that, the need for two-dimensional dimension measurement such as a contact hole and a wiring pattern in addition to the prior-art line and space measurements (one-dimensional length measurement) is increasing for a testing/measuring device on the basis of a scanning electron microscope which observes a superfine pattern.

However, in the prior-art technologies, when a fine pattern formed of an insulating material such as resist or $SiO_2$ is subjected to SEM observation, the profile line intensity of the pattern depends on the electron scanning direction (the intensity of the pattern edge parallel with the electron scanning direction is lowered). This is caused by the fact that the sample is charged by electron irradiation, and thus, shape distortion or uneven brightness occurs in an image. FIG. 1 shows an example of an electron scanning method in a view field when an image is obtained. An image of the resist pattern (FIG. 2(a)) obtained by this scanning method is shown in FIG. 2(b). The profile line intensity of the edge of the resist and the line profile depend on the electron scanning direction, and the profile line (parallel edge) in parallel with the electron scanning direction might be lost in some cases. If a pattern profile line is extracted by using this image, a defect (pattern outline loss) or an erroneous extraction (occurrence of ghost, that is, a line is detected where there should not have been a pattern) might occur in the profile data as illustrated in FIG. 2(c). As a result, measurement of the original processed dimension or shape of the pattern on the sample on the basis of profile line information becomes difficult.

The causes for that include the fact that the charged state on the sample surface is different depending on the relative direction of electron scanning and the pattern edge. As illustrated in FIG. 3, if electrons are made to scan in parallel with the pattern edge (FIG. 3(a)), positive charging produced by the previous scanning line is stronger than the perpendicular scanning case (FIG. 3(b)), and probability of return of the secondary electrons generated by electron beam irradiation to the sample surface becomes high. As a result, the profile line intensity on the image is reduced, the profile of the pattern cannot be extracted and the dimension or shape measurement of the pattern is obstructed.

In order to suppress the above obstruction, the influence of the electron-beam irradiation charging needs to be suppressed. Conventionally, in order to suppress the charging caused by electron irradiation, the following methods have been disclosed. For example, Patent Literature 1 describes that an inactive gas is introduced into the vicinity of the sample and ionized by primary electron irradiation, and the charging generated on the sample surface during image taking is neutralized. Patent Literature 2 describes that irradiation charging is neutralized by a flood gun or primary electron beam (irradiation energy different from that in image taking) examination between frames in the image taking. Patent Literatures 3, 4, and 5 describe that the influence of irradiation charging is suppressed by controlling the scanning direction of the electron beam so that the primary electron beam scans the pattern edge perpendicularly or diagonally. Moreover, Patent Literature 6 describes a method of optimizing the scanning interval of the primary electron beam in the view field for each observation sample.

CITATION LIST

Patent Literature

Patent Literature 1: JP Patent No. 4057653
Patent Literature 2: U.S. Pat. No. 7,488,938
Patent Literature 3: U.S. Pat. No. 6,879,719
Patent Literature 4: U.S. Pat. No. 7,439,503
Patent Literature 5: U.S. Pat. No. 6,710,342
Patent Literature 6: JP Patent Publication (Kokai) No. 2008-123716A

SUMMARY OF INVENTION

Technical Problem

In general, a charged amount caused by electron beam irradiation and distribution of a sample including a non-metal material is known to largely depend on the following factors:

(1) The initial charged state before the electron beam irradiation on the sample: charged amount, distribution (2) Energy of primary electron, probe current, observation view field, irradiation time, and secondary electron/backscattered electron yield of the sample caused by electron beam irradiation. Order of the irradiation positions in the view field of electron beam.

(3) Movement, diffusion, reunion of electron/hole on non-metal material surface/BARC caused by electron beam irradiation (4) Electric field/magnetic field distribution of sample peripheral region during observation Patent Literature 1 describes that the charging caused by primary electron beam irradiation is suppressed on a real time basis by using ions and electrons generated from the inactive gas and by reuniting them with charges on the sample surface. However, this case has a problem that the beam diameter of the primary electron becomes large due to a collision with the inactive gas, and plane resolution of the image is lowered.

Also, Patent Literature 2 resets the initial charged state of the sample before frame irradiation for taking an image by using a flood gun or primary electron beam. However, in this case, accurate control of the sample potential with a flood gun or primary electron beam irradiation is difficult. Also, it has a problem that a throughput of image taking is lowered by that.

Patent Literature 3, Patent Literature 4, and Patent Literature 5 improve a detection rate of a secondary electron signal from the edge by refraining from scanning with the electron beam in parallel with the pattern edge so as to suppress a coulomb force of the secondary electrons and the charges on the sample surface. However, in order to determine the scanning direction, a process of obtaining an image in advance and extracting the pattern edge is needed, and it has a problem that the throughput of image taking is lowered. Also, in order to obtain an image high accuracy from a pattern with a small dimension and a complicated shape, positional control in scanning with the electron beam is difficult.

In Patent Literature 6, energy of secondary electrons is discriminated by using an energy filter, fluctuation in a sample potential is measured from a change in the obtained electron yield, and a time constant of charging formed during the electron beam irradiation is extracted. The scanning interval in interlace scanning is optimized on the basis of the extracted time constant, and distortion or magnification fluctuation appearing in the image is suppressed. A certain effect can be obtained by this method but was confirmed by experiments to be insufficient for improvement of edge intensity in an SEM image and shading suppression for trends to finer LSI patterns and more complicated pattern shapes. The shading is the same as ghost.

An object of the present invention is to provide a suitable scanning device which can improve contrast of a profile of a two-dimensional pattern and suppress shading by suppressing the influence of charging caused by primary charged particle radiation and by improving a detection rate of secondary electrons in observation using a scanning electron microscope.

Solution to Problem

In the present invention, in a scanning electron microscope which forms an image of a scanned region by scanning a two-dimensional region on a sample with an electron beam, scanning is performed by changing a scanning line density in accordance with the sample.

Moreover, the present invention includes a GUI, sample information input means which inputs information relating to the sample, and display means which displays a recommended scanning condition by input using the sample information input means on the GUI, and the scanning is performed with the scanning line density in accordance with the sample by selection of the recommended scanning condition.

Moreover, the present invention includes means which measures an electric characteristic of the sample, and scans by changing the scanning line density on the basis of the measured electric characteristic.

Moreover, in the present invention, the scanning is performed by controlling at least one of the scanning order of a plurality of scanning lines for scanning and time intervals between the scanning lines on the basis of the electric characteristic.

Moreover, in the present invention, the electric characteristic is a charging relaxation time constant of the sample calculated on the basis of a temporal change of the intensity of secondary charged particles emitted from the sample by radiating an electron beam to the sample.

Moreover, in the present invention, the electric characteristic is a charging relaxation time constant of the sample calculated on the basis of the temporal change of the intensity of the secondary charged particles emitted from the sample by radiating the electron beam to a plurality of spots on the sample.

Moreover, in the present invention, the scanning line density controls the scanning speed of the electron beam and/or the current of the electron beam.

Moreover, in the present invention, the scanning line density is $7.2 \times 10^{19}$ (C/nm) or less.

Moreover, in the present invention, the scanning line density is $3.52 \times 10^{-19}$ (C/nm) or less.

Moreover, in the present invention, the scanning line density is $3.2 \times 10^{-19}$ (C/nm) or less.

Moreover, in the present invention, (signal/noise) is calculated from an image, and the number of frames is calculated in accordance with the calculated value.

Moreover, in the present invention, a focal point or an astigmatism correction amount is calculated and the result is fed back to a charged particle optical system.

Moreover, in the present invention, a sample observation method in which an image for a scanned region is foamed by scanning a two-dimensional region on a sample with the electron beam, the scanning is performed by changing the scanning line density in accordance with the sample.

Moreover, in the present invention, the scanning is performed by means of a process of inputting information relating to the sample, a process of displaying a recommended scanning condition on the basis of the information relating to the sample on a GUI, and a scanning line density according to the sample by selecting the recommended scanning condition.

Moreover, in the present invention, an electric characteristic of the sample is measured, and the scanning is performed by changing the scanning line density on the basis of the measured electric characteristic.

Moreover, in the present invention, the scanning is performed by controlling at least one of the scanning order of a plurality of scanning lines for scanning and time intervals for scanning between the scanning lines on the basis of the electric characteristic.

Moreover, in the present invention, the electric characteristic is a charging relaxation time constant of the sample calculated on the basis of a temporal change of the intensity of secondary charged particles emitted from the sample by radiating an electron beam to the sample.

Moreover, in the present invention, the electric characteristic is a charging relaxation time constant of the sample calculated on the basis of the temporal change of the intensity of the secondary charged particles emitted from the sample by radiating the electron beam to a plurality of spots on the sample.

Moreover, in the present invention, the scanning line density controls the scanning speed of the electron beam and/or the current of the electron beam.

Moreover, in the present invention, the scanning line density is $7.2 \times 10^{-19}$ (C/nm) or less.

Moreover, in the present invention, the scanning line density is $3.52 \times 10^{-19}$ (C/nm) or less.

Moreover, in the present invention, the scanning line density is $3.2 \times 10^{-19}$ (C/nm) or less.

Moreover, in the present invention, (signal/noise) is calculated from an image, and the number of frames is calculated in accordance with the calculated value.

Moreover, in the present invention, a focal point or an astigmatism correction amount is calculated and the result is fed back to a charged particle optical system.

Advantageous Effects of Invention

According to the present invention, in observation using a scanning electron microscope, a suitable scanning electron microscope which can improve contrast of a profile of a two-dimensional pattern and suppress shading by suppressing the influence of charging caused by primary charged particle radiation and by improving a detection rate of secondary electrons and a sample observation method can be provided.

DESCRIPTION OF EMBODIMENTS

Embodiments of the present invention will be described below in detail using the attached drawings. The embodiments according to the present invention are only examples in realizing the present invention, and the present invention is not limited by these.

In the embodiments of the present invention, a method for determining an electron beam irradiation method which suppresses the influence of charging of electron beam irradiation on the basis of a measurement result of charging relaxation characteristics caused by electron beam irradiation (time constant) of the sample and a scanning electron microscope provided with that are provided.

The behaviors of secondary electrons and backscattered electrons emitted from the sample caused by electron beam irradiation largely depend on the charged amount and distribution on the sample in the vicinity of an irradiated area. Particularly, since motion energy of the secondary electrons predominant in the secondary signal is small (several eV), the orbit is largely changed by the coulomb force with the charges accumulated on the sample. The coulomb force received by the secondary electrons at the irradiation position is considered as follows.

Figure 4:
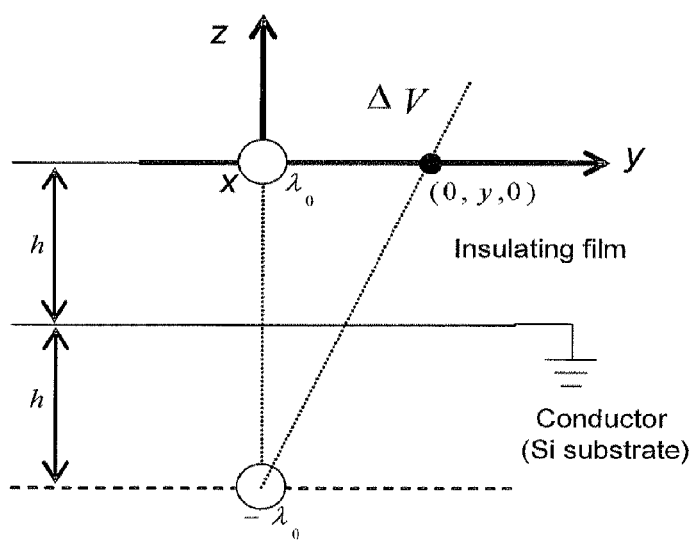
FIG. 4 is an explanatory diagram of a coulomb force action by a charge on the non-metal material surface.

If uniform charges (charge line density $\lambda 0$) on the x-axis (x=±l) illustrated in FIG. 4 are distributed on the surface of an insulating film on an Si substrate, the potential at a position (0 y 0) is calculated by the formula (1)

[Formula 1]

$$\Delta V \propto \frac{\lambda_0}{2\pi\varepsilon_0} \cdot \left( \int_0^{+l} \frac{dx}{\sqrt{y^2+x^2}} - \int_0^{+l} \frac{dx}{\sqrt{y^2+(2h)^2+x^2}} \right) \quad (1)$$

where $\lambda 0$: line density of charges on the sample surface immediately after electron beam irradiation (C/m)

[Formula 2]

$$\lambda_0 = \lambda_{incident} \times (\text{secondary signal yield} - 1) \quad (2)$$

[Formula 3]

$$\lambda_{incident} = \frac{\text{Probe current } I_p \text{ of primary electron beam}}{\text{Scanning speed } v \text{ of primary electron beam}} \quad (3)$$

21: View field size (m),
h: Film thickness of insulating film (m)
Similarly, the electric field intensity $E_y$ at the position (0 y 0) can be expressed by the formula (2).

[Formula 4]

$$E_y \propto \frac{\lambda_0}{2\pi\varepsilon_0} \cdot \frac{d}{dy} \left( \int_0^{+l} \frac{dx}{\sqrt{y^2+x^2}} - \int_0^{+l} \frac{dx}{\sqrt{y^2+(2h)^2+x^2}} \right) \quad (4)$$

According to the formulas (2), (3), and (4), reduction of the scanning line density $\lambda$ incidence of the primary charged particle radiation is effective in suppressing the coulomb force affecting the orbit of the secondary electrons.

In the observation method of the sample according the present invention, by setting the scanning line density $\lambda$ incidence when the sample is irradiated with the primary charged particles to $7.20 \times 10^{-19}$ (C/nm) or less, the throughput is improved, and the horizontal lines become visible. It was confirmed by experiments that the scanning condition of the primary charged particle radiation is preferably determined so as to realize reduction to $3.52 \times 10^{-19}$ (C/nm) or less, the throughput is improved, and the horizontal lines become clearer and have the same contrast as the vertical lines.

Moreover, an exchange time change of the charges caused by electron beam irradiation is different depending on the material and structure of the sample in general. In order to suppress mutual coulomb action of secondary electrons and sample charging, measurement of the temporal change of charging for each sample and selection of an optimal scanning method for that are needed in principle. Thus, the observation method of the sample according to the present invention includes means which disperse energy of secondary electrons emitted from the sample by primary charged particle radiation by using an energy filter and calculates the charging relaxation time constant of the sample from the temporal change of intensity of the secondary electrons having specific energy and scanning-order determining means which determines the order of scanning with the primary charged particle radiation on the sample on the basis of the calculated time constant, and by including a process in which the sample is scanned with the determined scanning line density and scanning order.

The scanning electron microscope according to the present invention is a scanning electron microscope which radiates the primary charged particle beam to the sample and obtains an image of the sample by at least one of the secondary electrons and backscattered electrons emitted from the sample and includes means which adjusts at least one of the probe current and the scanning speed of the primary charged particle beam so that the scanning line density of the primary charged particle beam becomes $7.20 \times 10^{-19}$ (C/nm) or less or a recommended value of $3.52 \times 10^{-19}$ (C/nm) or less, and the sample is scanned and observed.

Moreover, a scanning electron microscope in another mode according to the present invention is a scanning electron microscope which radiates the primary charged particle beam to the sample and obtains an image of the sample by at least one of the secondary electrons and backscattered electrons emitted from the sample and provides means which adjusts at least one of the probe current and the scanning speed of the primary charged particle beam so that the scanning line density of the primary charged particle beam becomes $7.20 \times 10^{-19}$ (C/nm) or less or a recommended value of $3.52 \times 10^{-19}$ (C/nm) or less, an energy filter which disperses the secondary electrons having energy at a specific value or more in the secondary electrons emitted from the sample, means which extracts and records the charging relaxation time constant from the temporal change of the secondary electron signal intensity measured by the energy filter, and scanning-order determining means which determines the scanning order of the primary charged particle beam on the basis of the time constant, and the sample is observed by the determined scanning method of the primary charged particle beam.

According to the present invention, charging caused by primary charged particle radiation is reduced during the observation, and the secondary electrons or backscattered electrons emitted from the sample can minimize the influence on the charging. Thus, improvement of the profile line intensity of the two-dimensional pattern including a nonmetal material and suppression of shading can be realized, and more stable and highly accurate observation can be made.

Moreover, according to the present invention, as compared with the prior-art observation technologies, when an image is to be obtained, detection efficiency (secondary signal intensity/number of injected electrons of the primary charged particles in each pixel) of secondary signals (secondary electrons and backscattered electrons) is high, and thus, an image having a similar signal/noise ratio can be obtained in a shorter time, which results in faster observation.

Figure 1:
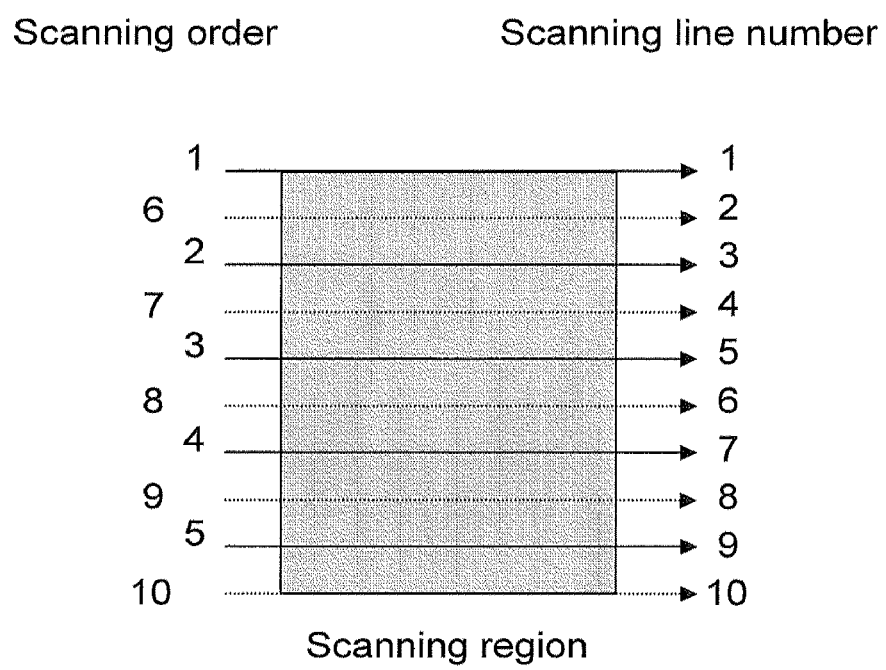
FIG. 1 illustrates interlace scanning.
Figure 2:
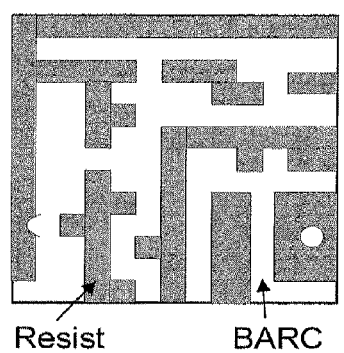
FIG. 2 is an example of profile extraction of a resist gap pattern by using a scanning method.
Figure 2:
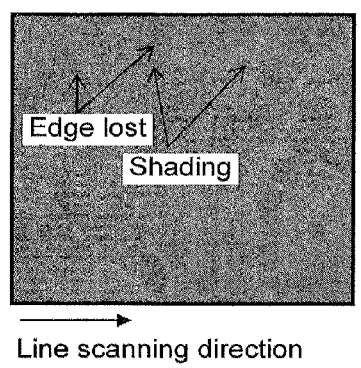
Figure 2:
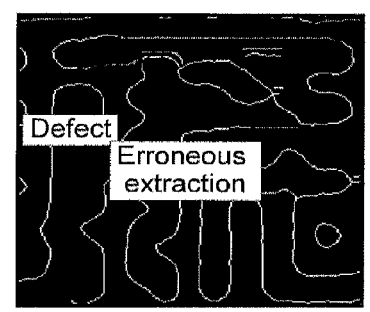
Figure 2:
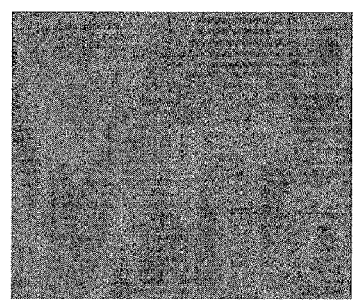
Figure 2:
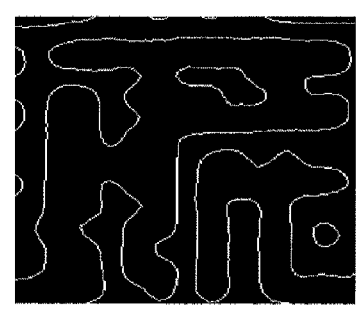
Figure 3:
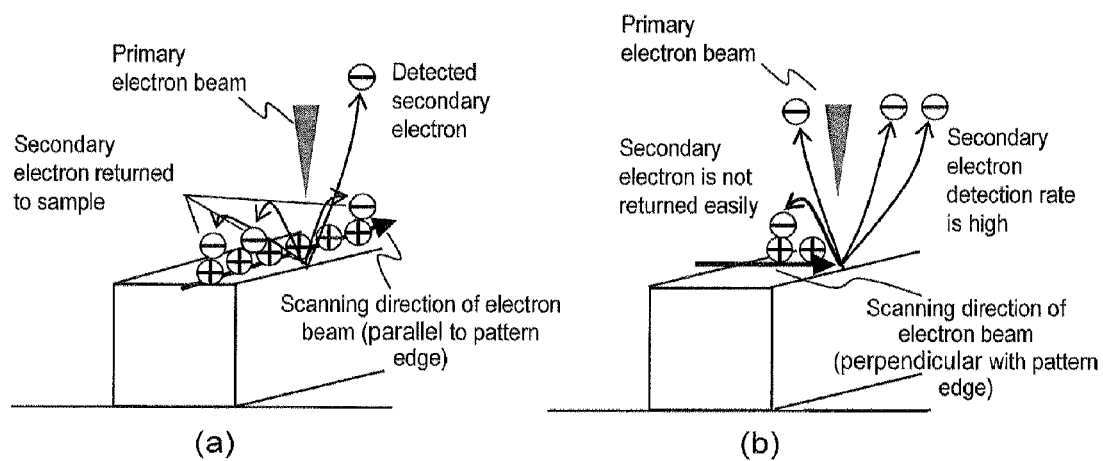
FIG. 3 is an explanatory diagram of influences on a pattern edge of a scanning direction of an electron beam, charging distribution and on a secondary electron orbit.

An image of a resist pattern illustrated in FIG. 2(a) photographed by using the primary electron beam scanning line density and in-field line scanning-order control provided by the present invention is illustrated in FIG. 2(d). Also, the profile extraction result thereof is illustrated in FIG. 2(e). It was proved by experiments that profile intensity is improved and accuracy of profile line extraction is improved thereby in an image of a two-dimensional pattern.

Further features of the present invention will be made clear below from the best mode for carrying out the present invention and the attached drawings.

Embodiment 1

[Configuration of Device]

Figure 5:
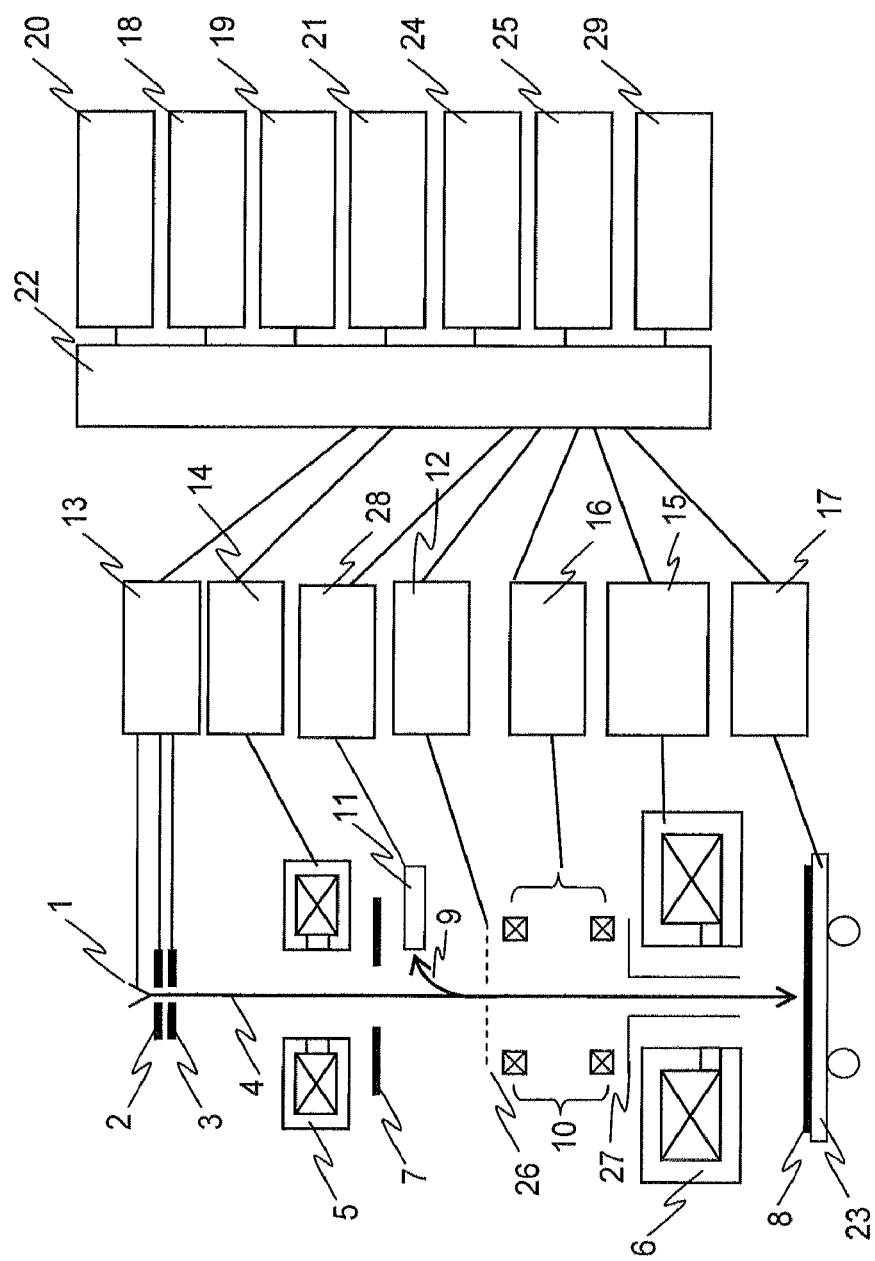
FIG. 5 is an explanatory diagram of a device configuration of Embodiment 1.

An outline configuration of a scanning electron microscope in an embodiment of the present invention is illustrated in a block diagram in FIG. 5.

Between a cathode 1 and a first anode 2, a voltage is applied by a high-voltage control power supply 13 controlled by a calculating device 22, and a predetermined emission current is drawn from the cathode 1. Since an acceleration voltage is applied between the cathode 1 and a second anode 3 by the high-voltage control power supply 13 controlled by the calculating device 22, a primary electron beam 4 emitted from the cathode 1 is accelerated and progresses to a lens system in the rear stage. The primary electron beam 4 is converged by a focusing lens 5 controlled by a focusing-lens control power supply 14 in compliance with an instruction of an input device, deprived of an unnecessary region of the primary electron beam 4 by a diaphragm plate 7 and controls the probe current Ip of the primary electron beam.

After that, the primary electron beam is converged on a sample 8 as a micro spot by an objective lens 6 controlled by an objective-lens control power supply 15 and scans the sample by a polarizer 10 in a two-dimensional manner. A scanning signal of the polarizer 10 is controlled by a polarizer control power supply 16 in compliance with scanning conditions including the view-field size, scanning speed, and the number of pixels specified by the input device 19. Also, the sample 8 is fixed onto a sample stage 23 which is movable two-dimensionally. The movement of the sample stage 23 is controlled by a stage control portion 17. A secondary electron 9 generated from the sample 8 by radiation of the primary electron beam 4 passes through an energy filter 26 controlled by a control power supply 12 of the energy filter and detected by a secondary electron detector 11, and a drawing device 20 executes control of converting the detected secondary signal to a visible signal and aligning it on another plane as appropriate and displays an image corresponding to the surface shape of the sample on an SEM image display device 18 as an image.

The signal detected by the secondary electron detector 11 is amplified by a secondary signal amplifier 28 and then, accumulated in an image memory in the drawing device 20. An address signal corresponding to a memory position in the image memory is generated in the calculating device 22 or in a computer installed separately and converted to an analog signal. Then, the address signal in the X-direction supplied to the polarizer 10 is a digital signal repeating from 0 to 512 if the image memory is raster scanning of 512×512 pixels, for example, while the address signal in the Y-direction is added with 1 when the address signal in the X-direction reaches 512 from 0 and is a digital signal repeating from 0 to 512. This is converted to an analog signal.

Since the address in the image memory corresponds to the address of a polarization signal for scanning with the electron beam, a two-dimensional image in an electron beam polarization region by the polarizer 10 is recorded in the image memory. The signals in the image memory can be sequentially read out in a time series by a reading-out address generation circuit synchronized by a reading-out clock. The signal read out in correspondence with the address is converted to an analog signal and becomes a brightness modulation signal of the image display device 18.

The image memory is provided with a function of synthesizing and recording image data for S/N improvement. For example, one complete image is formed by overlapping and recording images obtained in 8 sessions of two-dimensional scanning. That is, a final image is formed by synthesizing images formed by one session or more of the unit of X-Y scanning. The number of images (hereinafter referred to as the number of cumulative frames) for forming one complete image can be arbitrarily set, and a proper value is set, considering conditions such as secondary electron generation efficiency or the like.

The input device 19 realizes interface between an operator and the calculating device 22, and the operator executes control of each of the above-described units through this input device 19 and also specifies a measurement point or gives an instruction of dimensional measurement.

Moreover, this device is provided with a line profile extraction function 24, which is means which extracts a line profile on the basis of the detected secondary electron or the like. The line profile is formed on the basis of a detected amount of the secondary electrons, brightness information of the image and the like in scanning with the primary electron beam, and the obtained line profile is used for dimensional measurement or the like of a pattern formed on a semiconductor wafer, for example. In this Embodiment 1, the line profile is used in a function 25 for determining whether or not to perform extraction of a pattern profile (function to determine whether or not to perform extraction of a pattern profile).

Moreover, in a storage device 21, pattern layouts to be inspected, edge shape information, and observation recipes are stored.

[Charging Control Method]

Figure 6:
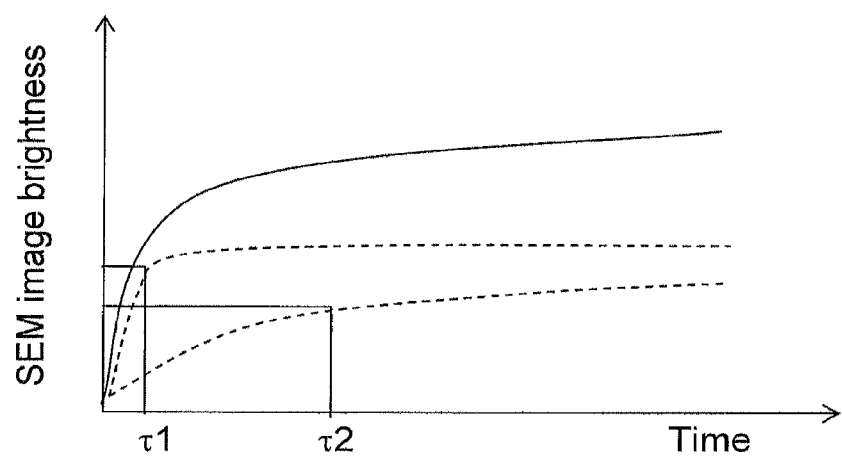
FIG. 6 is an explanatory diagram on extraction of a charging relaxation time constant from a temporal change of image brightness in a charged region.

An example of measurement of charging relaxation characteristics (time constant) of a sample is illustrated in FIG. 6.

When the primary electron beam 4 is radiated to the sample 8, a secondary signal 9 (including at least one of secondary electron and backscattered electron) is generated. Since an electric field formed by the sample holder 23, the objective lens 6, and an electrode 27 acts as an accelerating electric field to the secondary signal 9, it is pulled up into the passage of the objective lens 6 and rises while being subjected to the action of the magnetic field of the objective lens 6 and further passes through the scanning polarizer 10 and enters the energy filter 26. Depending on a set value of the energy filter 26, a secondary signal component having low motion energy cannot pass through the energy filter 26, while a component having motion energy higher than that passes through the energy filter 26. The primary electron beam 4 is radiated to the sample 8 with a certain dose amount, lets the sample 8 charged, and an irradiation position potential Vs of the sample 8 is changed. Here, the sample potential Vs is the sum of a charged potential ΔVs of the sample 4 generated by irradiation of the primary electron beam 4 and a retarding potential Vr applied to the sample holder 23. If the sample potential Vs is increased by charging, the amount of the secondary signal which can pass through the energy filter 26 is decreased, and the amount of the secondary signal detected by the detector 11 is decreased, and brightness on the image is reduced. The primary electron beam 4 is radiated to the sample 8 in advance so as to form a charged region, the same region is irradiated again after a certain time interval, and the obtained brightness on the image is recorded. FIG. 6 shows an example of a change curve of lightness of the charged region on the screen when the time interval is changed. At this time, the scanning method with the primary electron beam 4 may be arbitrarily set in compliance with the purpose (one-point irradiation, line scanning, two-dimensional scanning). Also, in order to raise S/N, the measurement is made at a plurality of spots on the sample, and the result is averaged and outputted.

Figure 7:
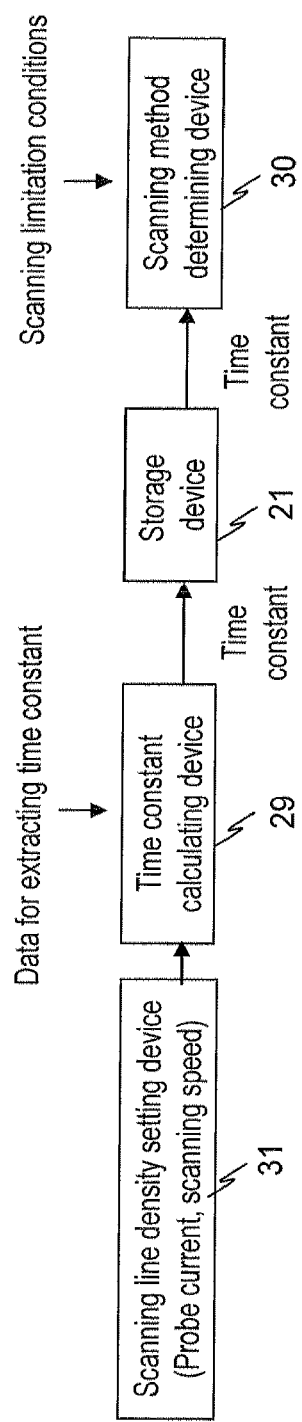
FIG. 7 is a configuration diagram until a primary electron beam scanning method is determined.

As illustrated in FIG. 7, which is a configuration diagram until the primary electron beam scanning method is determined, first, the probe current and the scanning speed of the primary electron beam is determined so that the scanning line density of the primary electron beam 4 becomes a predetermined value or less on the basis of the irradiation energy of the primary electron beam 4, the secondary electron and backscattered electron yield of the sample, and the upper limits of the probe current and the scanning speed as illustrated in the formula (3). The scanning line density here is defined as a charge amount injected per unit length on the sample.

Subsequently, the temporal change curve of the brightness is inputted into the time constant calculating device 29, and a charging relaxation time constant of the sample 8 is extracted and stored in the storage device 21. The scanning method of the primary electron beam 4 is determined by the scanning method determining device 30 by using the stored charging relaxation time constant and the limitation conditions of the primary electron scanning (including any of the number of image pixels, view field, and the cumulated number). The scanning method includes the probe current and the scanning speed which determine the scanning line density of the primary electron beam 4 and the scanning order in the view field corresponding to the scanning line density. For determination of the scanning order, a similar method to the prior-art technologies may be used, for example. By using the determined scanning method or the scanning method selected by the operator from candidates, the primary electron beam 4 is used to scan the sample 8 so as to obtain an image and the sample is observed.

If the temporal change of the brightness is expressed as $S(t) \propto 1-\exp(-t/\tau)$ ($\tau$: charging relaxation time constant of sample), it is acquired by fitting with a curve illustrated in FIG. 6. The components whose brightness rapidly rises and enters a steady state are caused by extinction of an electron/hole pair in the sample or reunion of the secondary electrons or backscattered electrons emitted once to the outside of the sample with the hole on the sample or the like, and this time constant is set to $\tau 1$. The component changing slowly is considered to be caused by a leaking process through the surface of the sample or bulk, and this time constant is set to $\tau 2$. In a normal SEM observation condition, it is $\tau 1 < \tau 2$.

If SEM observation/photographing time is smaller than the time constant $\tau 1$, relaxation of the SEM observation/irradiation charging during photographing is small, and thus, influences on the pattern profile line intensity and shading are large. If the SEM observation/photographing time is between $\tau 1$ and $\tau 2$, it is possible to suppress the influences for that portion by relaxation of the charging corresponding to $\tau 1$. If the SEM observation/photographing timing is longer than $\tau 2$, it becomes possible to suppress the influences of the both. In this embodiment, by providing a control method of irradiation charging having the time constant $\tau$ equal to or less than the SEM observation/photographing time and a scanning electron microscope using that, attention is paid to the time of line scanning and the scanning method is determined so that the charging with relatively short time constant is suppressed to the minimum, whereby an image with a high image quality capable of two-dimensional observation is obtained.

[Processing Sequence]

Figure 8:
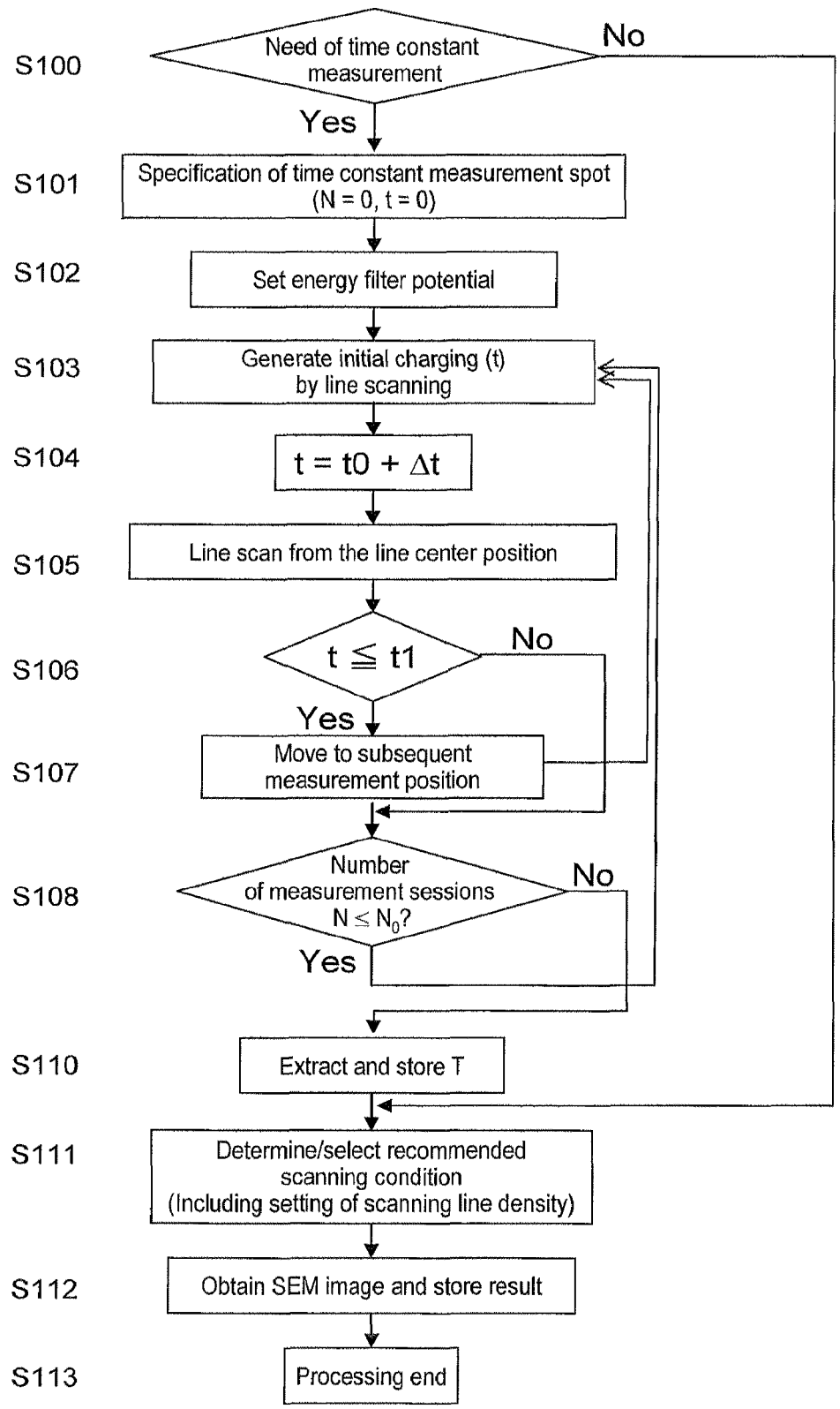
FIG. 8 is a sequence for obtaining an image in Embodiment 1.

FIG. 8 is a flowchart for explaining a sequence for obtaining an image according to this embodiment. At Step 100, it is determined whether the result of measurement history of the previous charging relaxation time constant of the same type of sample or the same wafer is stored in the storage device 21 or not, and need of charging relaxation time constant measurement is determined. If the charging relaxation time constant is to be measured, the electron beam is moved to charging relaxation time constant measurement spots at Step 101. The measurement spots of the charging relaxation time constant is preferably a flat portion in the vicinity of the observation region or an observation portion or a pattern portion equivalent to them.

Subsequently, at Step 102, a retarding potential, which is an energy filter potential to be applied to the energy filter 26 is set and applied to the energy filter 26. The energy filter potential is a potential to take in the secondary electron with high energy not affected by local charging distribution on the sample. From Step 103 to Step 109, the primary electron beam 4 is radiated to the sample 8 so as to obtain the secondary signal 9 and the irradiation intermediate time relationship. At Step 103, line scanning is performed on the sample with a constant dose amount and charging is generated. Waiting for a time interval of $\Delta t$ (Step 104), the line scanning is performed from the center position on the line (Step 105) and moved to the subsequent measurement position (Step 107). Within a predetermined time $\tau 1$ (Step 106), the aforementioned Step 103 to Step 107 are repeated. Also, in order to obtain constant S/N, the number of measurement sessions is set in advance (Step 108), and the measurement from the aforementioned Step 103 to Step 107 is repeated.

At Step 110, data obtained till Step 109 is inputted into the time constant calculating device 29, and the charging relaxation time constant $\tau$ of the sample is calculated by the above-described method and stored in the storage device 21. At Step 111, on the basis of the extracted charging relaxation time constant $\tau$ and the limitation conditions for scanning with the primary electron beam 4, an optimal scanning method is determined by the method illustrated in FIG. 7. If there are a plurality of candidate scanning methods, selection can be made also by an operator. As an example, a list of scanning methods corresponding to the charging relaxation time constant $\tau$ of the sample in each scanning line density is stored in the storage device 21 in advance, and when the scanning line density and the charging relaxation time constant $\tau$ are inputted, candidates of the scanning method are displayed and the method is determined by an operator.

At Step 112, an SEM image of the sample is obtained by using the scanning method outputted from the scanning method determining device, and observation is made. Also, the scanning method outputted here is stored together with the sample in the storage device so that an image can be obtained with the optimal scanning method without charging relaxation time constant measurement or optimization of the scanning method if the material, structure or pattern of the sample is considered as equal in the subsequent observation.

If it is determined at Step 100 that measurement of the charging relaxation time constant $\tau$ is not required, the routine proceeds to Step 111. At Step 111, if there is measurement history of the charging relaxation time constant with the equal sample in the past, the charging relaxation time constant is read out of the storage device 21. If there is no measurement history, the constant is specified from the input device 19 or a default value is used.

In this Embodiment 1, an example of the charging relaxation time constant is described, but a charging change characteristic time constant in electron beam irradiation may also be used.

Embodiment 2

Figure 9:
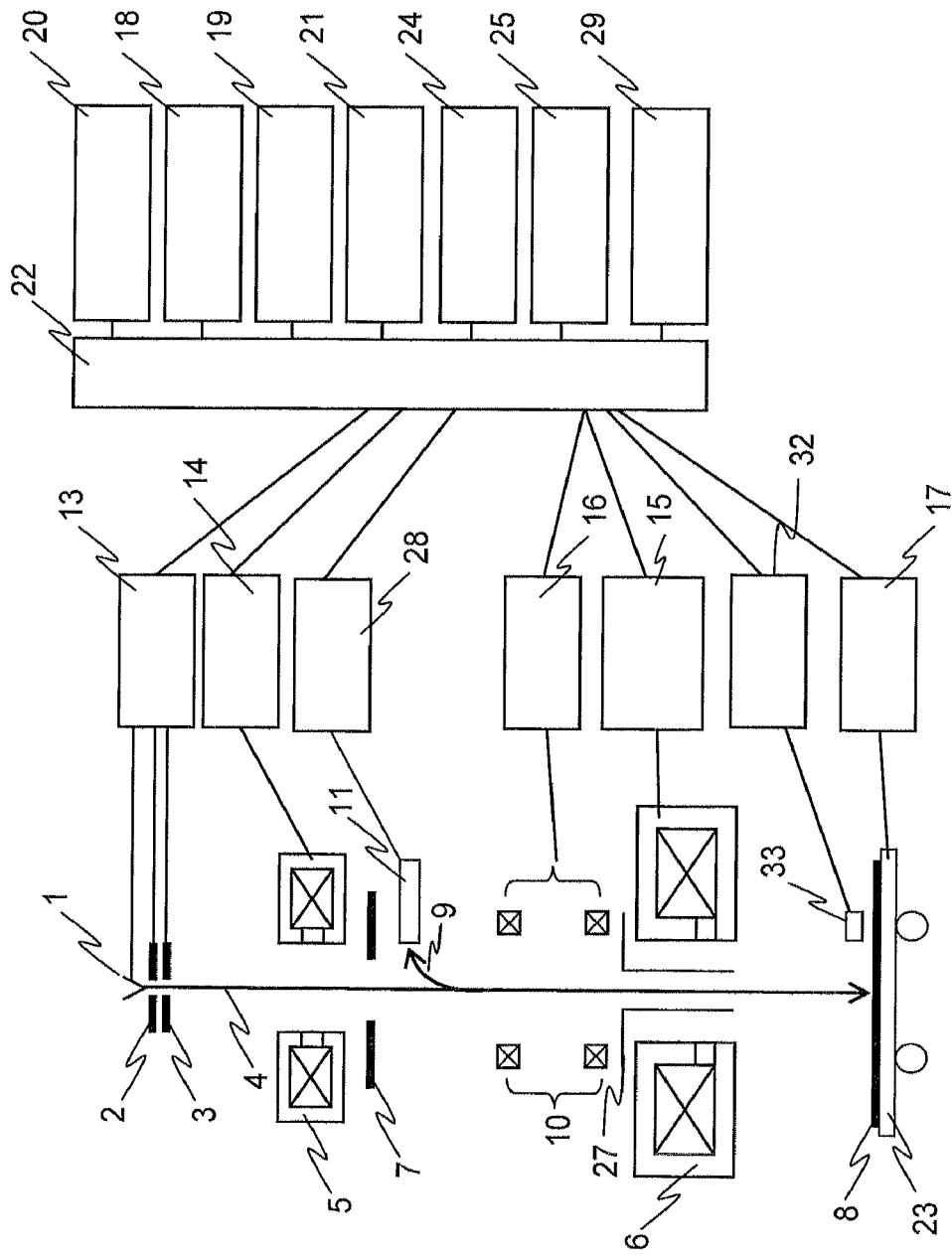
FIG. 9 is an explanatory diagram of a device configuration of Embodiment 2.

This embodiment will be described using a device configuration illustrated in FIG. 9.

Figure 10:
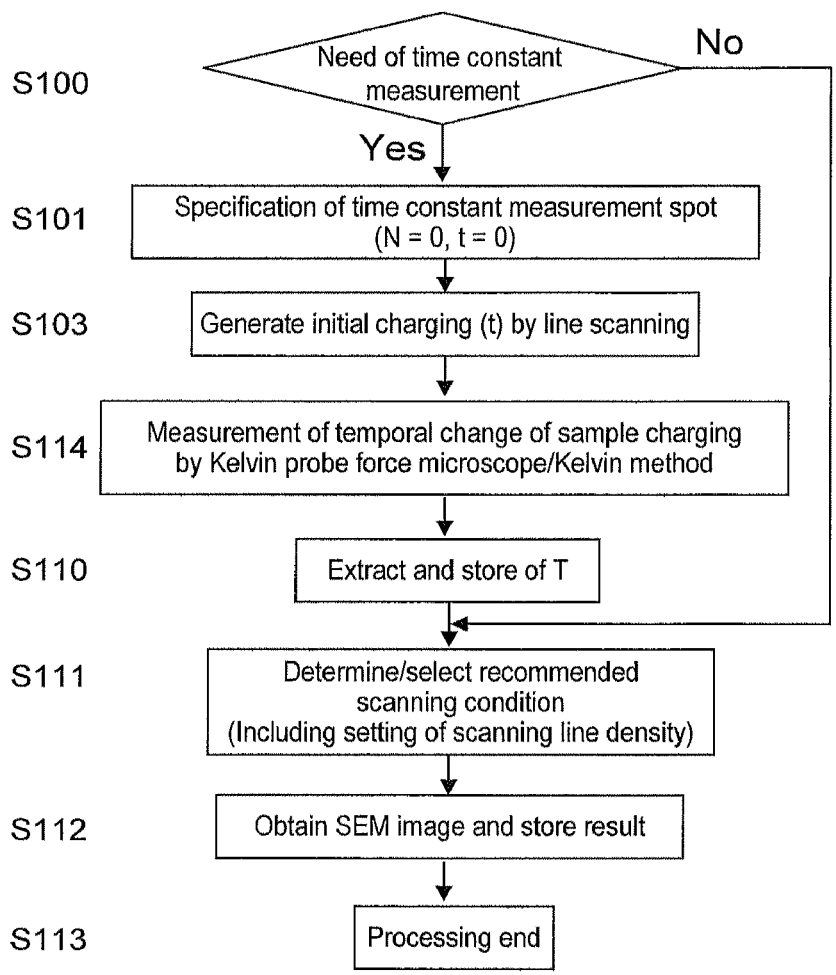
FIG. 10 is a sequence for obtaining an image in Embodiment 2.

As compared with the device configuration of Embodiment 1 illustrated in FIG. 5, in the device configuration of Embodiment 2, a Kelvin probe force microscope or a Kelvin probe is installed instead of the energy filter for measuring the charging relaxation characteristics of a sample and a control system thereof. The temporal change of the charging relaxation of the sample is measured through the probe control portion 32 by using the Kelvin probe force microscope or the Kelvin method using either of them. The primary electron beam scanning method is determined in the configuration diagram illustrated in FIG. 7 by using the measurement data. A flowchart for obtaining an image according to this embodiment is illustrated in FIG. 10. As compared with the flowchart in Embodiment 1, the Kelvin probe force microscope or the Kelvin method is used instead of the method using the energy filter 26 for measurement of temporal change of sample charging.

Embodiment 3

Figure 11:
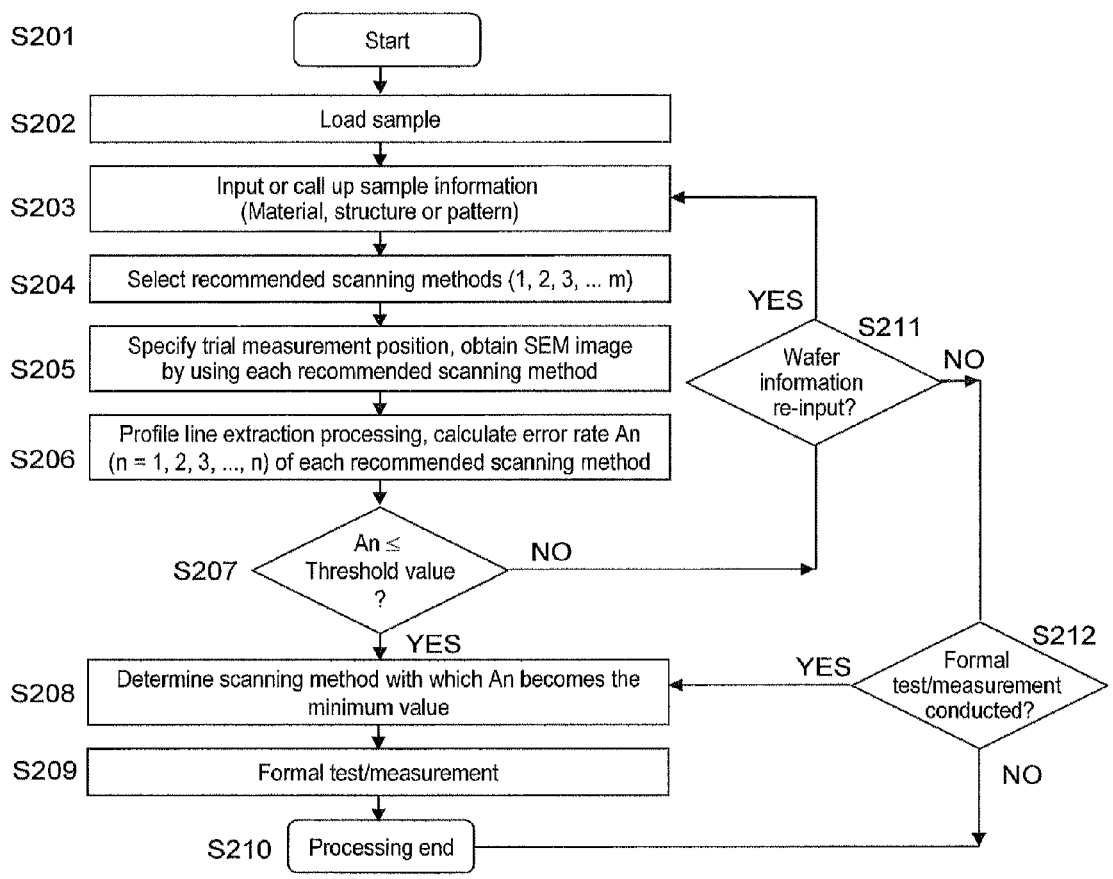
FIG. 11 is a sequence for obtaining an image in Embodiment 3.

This embodiment will be described by using a flowchart illustrated in FIG. 11.

Starting at Step 201, a sample is loaded (Step 202). At Step 203, information relating to the sample is inputted or called from the device. At Step 203, a sample for observation is loaded, and material information relating to electron beam irradiation charging is inputted. At Step 204, candidates of scanning methods recommended from the storage device 21 are determined on the basis of the sample information. At Step 205, trial measurement positions are specified in order to further narrow the recommended scanning methods, and an image is obtained by using each of the recommended scanning methods. At Step 206, pattern profile extraction processing is applied to the image obtained at the previous step, and an extraction error rate is calculated. If there is a scanning method having the extraction error rate smaller than a predetermined value, formal observation is made by using the scanning method, and the processing is finished. If there are a plurality of scanning methods that satisfy the conditions, the scanning method with the minimum extraction error rate is used for the formal observation. If there is no scanning method having the extraction error rate smaller than the predetermined value, sample information for determining the recommended scanning methods is inputted again and retried, or the formal observation is made by using the scanning method with the smallest extraction error rate in the trial measurement or the routine is finished without making measurement.

Alternatively, instead of the extraction error rate, the candidates for the scanning method may be determined by setting a threshold value of pattern edge contrast and by extracting the edge contrast from the image obtained from each of the scanning methods and comparing it with the set threshold value.

Alternatively, it may be so configured that S/N of an image is acquired by the determined scanning method, the number of cumulative frames of the image in the formal observation is calculated and fed back to the image obtaining method.

Embodiment 4

Figure 12:
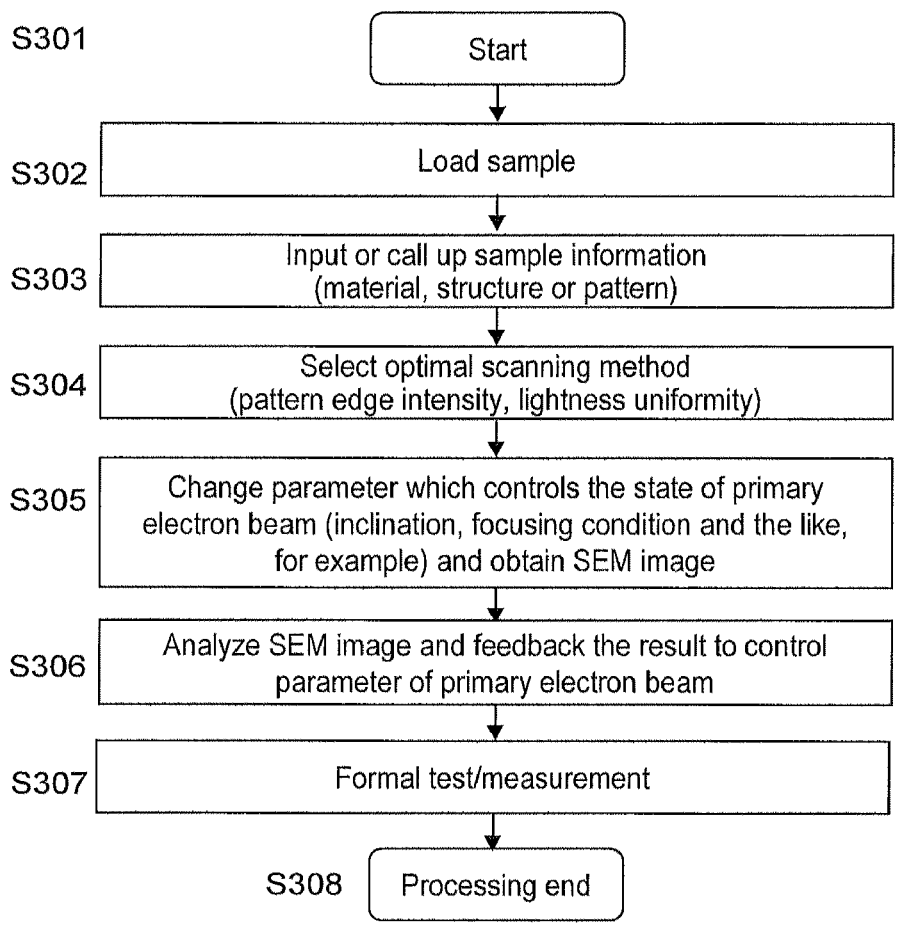
FIG. 12 is a sequence for obtaining an image in Embodiment 4.

This embodiment will be described by using a flowchart illustrated in FIG. 12. At Step 301 to Step 303, a sample for observation is loaded, and material information relating to electron beam irradiation charging is inputted. At Step 304, an optimal scanning method in pattern edge intensity, uniformity and lightness uniformity is determined. The determining method may be the method described in Embodiment 3. At Step 305, a parameter which controls the primary electron beam is changed with the recommended scanning method, and a series of images are obtained. At Step 306, analysis processing is applied to the images obtained at the previous step, a correction value of the parameter which controls the state of the primary electron beam (focus state, astigmatism and the like, for example) is extracted, and feedback is made to them. At Step 307, formal observation is made by using the corrected primary electron beam.

Embodiment 5

Figure 13:
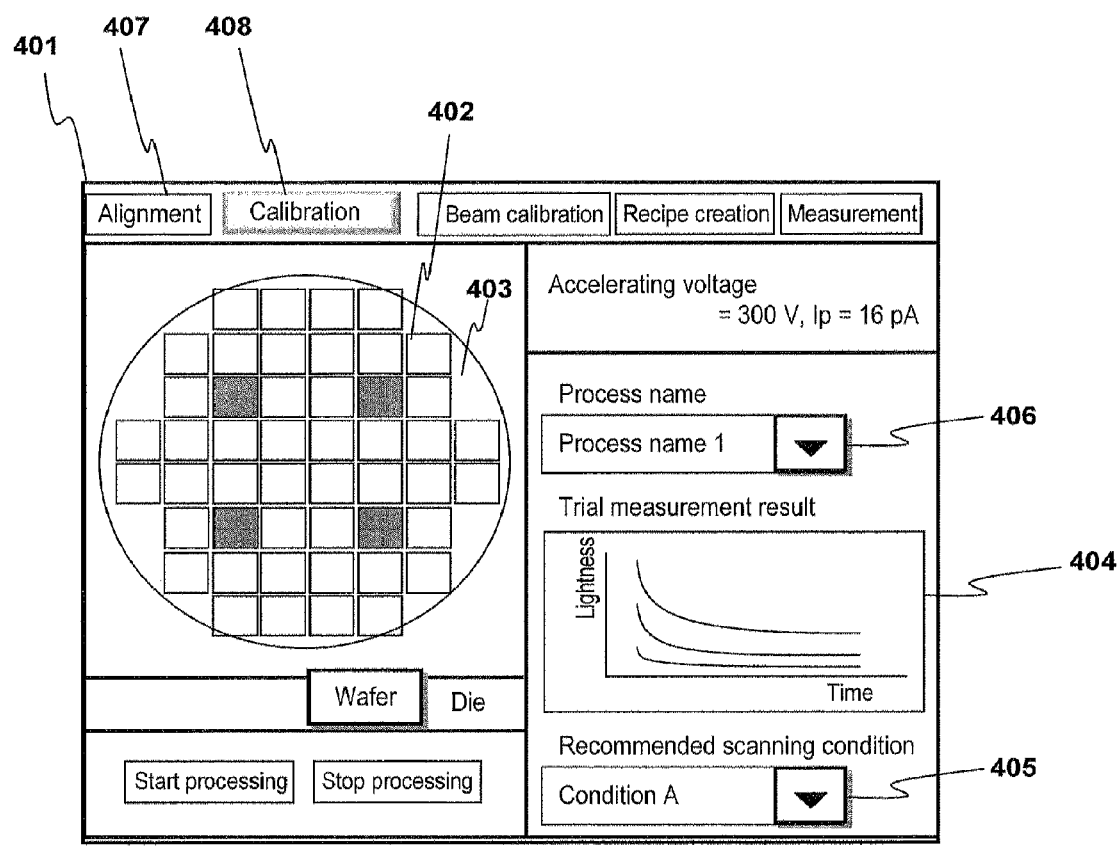
FIG. 13 is a GUI for obtaining an image in Embodiment 5.

Supplemental explanation of the contents of Embodiment 1 will be given by using a GUI 401 illustrated in FIG. 13 and FIG. 8. When a user selects alignment 407 and positions of an arbitrary plurality of layout 402, the alignment is processed by the calculating device 22. This processing is equivalent to the processing of S100 in FIG. 8. If it is Yes at S100, the user selects calibration 408 in FIG. 13. At that time, information relating to the sample (process name of the sample when the sample is prepared, film thickness of the resist, material, pattern and the like) is selected. After that, processing at S101 in FIG. 8 is conducted, and the processing is conducted through S111.

The recommended condition is displayed on a GUI 405 at S111 and determined by selection of the recommended condition by the user. The recipe is prepared in accordance with the recommended condition, scanning is performed with the scanning line density corresponding to the sample, and an SEM image is obtained (S112). By making measurement with a suitable scanning line density in this way, particularly the horizontal lines of the sample pattern can be measured. Also, operability for the user can be improved through the GUI.

This GUI is formed of the layout 402 of a sample 403, the "alignment" screen on which setting and calibration of position, inclination and the like are made, a "calibration" screen for selection of a beam scanning condition, a "beam calibration" screen on which the selected beam condition is calibrated, a "recipe creation" screen on which setting of positions of test/measurement and a sequence is made, and a "measurement" screen on which test/measurement is conducted. On the "calibration" screen, means for inputting/selecting information including a material and a structure of a wafer is provided so that a user can make an input. The device measures the charging characteristics of the sample to be measured on a specific location on the sample and provides a recommended scanning condition or calls up a recommended scanning condition from a database. A trial measurement result by those scanning conditions is displayed. On the basis of the result, the scanning condition to be used for the formal test/measurement is determined by the user or automatically.

Embodiment 6

Figure 14:
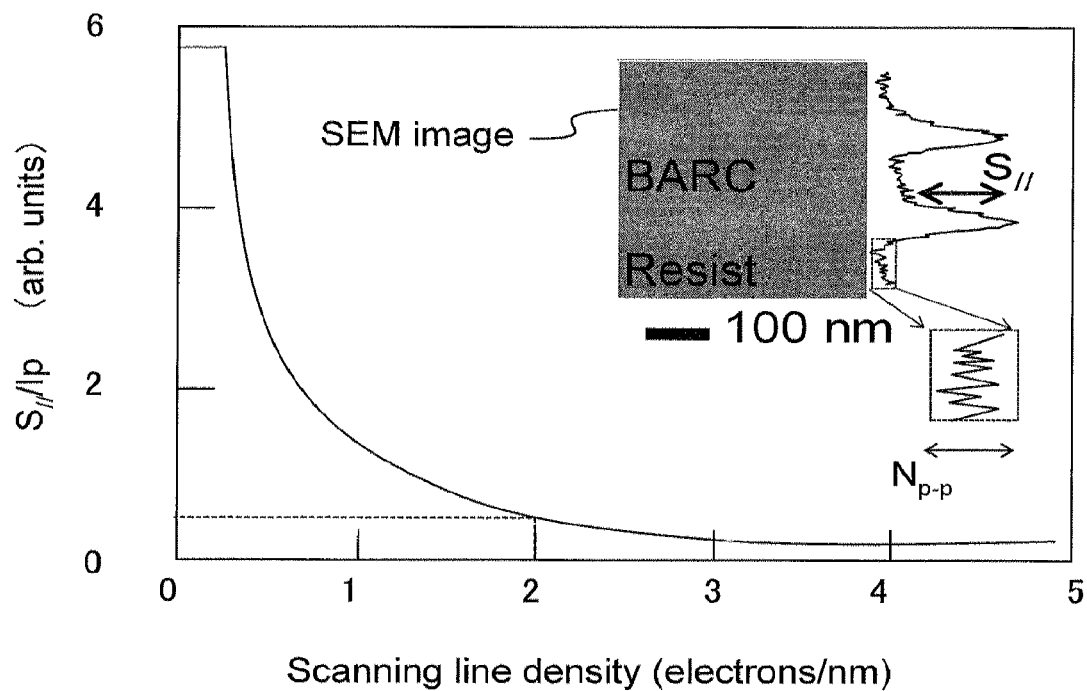
FIG. 14 is a diagram illustrating a relationship between an electron beam incident line density and secondary signal detection efficiency in Embodiment 6.

This embodiment will be described by using a graph illustrated in FIG. 14. FIG. 14 illustrates an SEM image of a space pattern in which a film structure is made of resist/BARC/Si substrate (hereinafter referred to as a parallel edge since the edge direction of the space is made parallel with the line scanning direction when the SEM image is obtained) as an example. A line profile of the parallel edge extracted from the SEM image is also illustrated. A difference between the space portion and the maximum value of the white band is assumed to be parallel edge intensity $S_{//}$. FIG. 14 illustrates dependency of the parallel edge intensity $S_{//}/Ip$ of the resist pattern per unit incident electron by the electron beam scanning line density. If the scanning line density is 0.5 pieces/nm or less, it indicates that $S_{//}/Ip$ has a saturating tendency. When a pattern profile is extracted from an SEM image for two-dimensional measurement, an (allowable) erroneous extraction rate is different depending on an analysis tool or a measurement request. Before the test/measurement, the parallel edge intensity illustrated in FIG. 14 or a parallel/perpendicular edge intensity ratio is measured, and a scanning condition including the electron beam scanning line density is selected in compliance with a predetermined threshold value. In our evaluation, by setting the electron beam scanning line density to 2 pieces/nm or less (that is, $3.2 \times 10^{-19}$ (C/nm) or less), $S_{//}/N_{p-p}$ becomes 1.1 or more, and extraction of a pattern profile is not obstructed.

REFERENCE SIGNS LIST 1 cathode
2 first anode
3 second anode
4 primary electron beam
5 focusing lens
6 objective lens
7 diaphragm plate
8 sample
9 secondary electron
10 polarizer
11 secondary electron detector
12 energy filter control power supply
13 high-voltage control power supply
14 focusing-lens control power supply
15 objective-lens control power supply
16 polarizer control power supply
17 stage control portion
18 image display device
19 input device
20 drawing device
21 storage device
22 control calculating device
23 sample stage
24 line profile extraction function
25 function of determining whether or not to extract pattern profile
26 energy filter
27 electrode
28 secondary signal amplifier
29 time constant calculating device
30 scanning method determining device
31 scanning line density setting device
32 probe control portion
33 probe for Kelvin probe force microscope or Kelvin probe
401 GUI for test/measurement control
402 layout of chip on wafer
403 test/measurement target (wafer)
404 measurement result of charging relaxation characteristics
405 selection menu of recommended scanning condition
406 selection portion of information of test/measurement wafer
407 alignment selection portion
408 calibration selection portion

The invention claimed is:

1. A scanning electron microscope which forms an image of a scanned region by scanning a two-dimensional region on a sample with an electron beam, comprising:
    means which provides candidates of recommended scanning methods and which acquires images of said sample using said candidates of recommended scanning methods,
    wherein the scanning electron microscope suppresses a number of injected electrons injected on said sample by said electron beam per individual single line scanned in a direction of said scanning by determining a probe current and a scan speed of scanning said individual single lines by said electron beam such that a scanning line density, which is a charge amount injected per unit of length on the sample by scanning of said electron beam, for each individual single line scanned by the electron beam on said sample is a predetermined value or less based on one or more electric characteristics of said sample derived from said images,
wherein said sample is scanned in individual single lines by the electron beam based on the determined probe current and scan speed, and
wherein a sample parallel edge intensity and a sample parallel to perpendicular edge intensity ratio is measured and the scanning line density is selected to be said predetermined value or less.

2. The scanning electron microscope according to claim 1, further comprising:
means which inputs information of said sample, determines whether an optimization procedure for a scanning strategy of said electron beam is necessary, provides candidate scanning method(s) to said sample upon determining the optimization procedure is necessary, and acquires images of said sample with the candidate scanning method(s), wherein
at least one of the following information is derived from said images taken by said scanning electron microscope: (1) brightness of the image(s), (2) contrast of edge(s) of features of said sample, (3) uniformity of the brightness of said images, (4) uniformity of said contrast of said edge(s) in said image(s), and a signal-to-noise ratio of said image(s).

3. The scanning electron microscope according to claim 1, wherein when the electric characteristics of said sample and/or the candidates of recommended scanning methods are stored, and
wherein said candidates of recommended scanning methods for said electron beam are read out when the information concerning to said sample is input, and said electron beam scans over said sample using said scanning method(s) automatically and acquires images.

4. The scanning electron microscope according to claim 1, wherein
a sequence of plural spatially separated line positions on said sample scanned by said electron beam are controlled.

5. The scanning electron microscope according to claim 1, wherein
said electric characteristic further includes a charging relaxation time constant of said sample calculated based on a temporal change of an intensity of secondary charged particles emitted from said sample by radiating the electron beam to said sample.

6. The scanning electron microscope according to claim 1, wherein said predetermined value is of said scanning line density is $7.2 \times 10^{-19}$ (C/nm).

7. The scanning electron microscope according to claim 1, wherein said predetermined value is of said scanning line density is $3.52 \times 10^{-19}$ (C/nm).

8. The scanning electron microscope according to claim 1, wherein the scan speed is increased from a normal scan speed.

9. The scanning electron microscope according to claim 1, wherein a focal point or an astigmatism correction amount is calculated and the calculation result is fed back to a charged particle optical system.

10. A sample observation method in which an image of a scanned region is formed by scanning a two-dimensional region on a sample with the electron beam, comprising the steps of:
providing candidates of recommended scanning methods and acquiring images of said sample using said candidates of recommended scanning methods; and
suppressing a number of injected electrons injected on the sample by said electron beam per individual single line scanned in a direction of said scanning by determining a probe current and a scan speed of scanning said individual single lines by said electron beam such that a scanning line density, which is a charge amount injected per unit of length on the sample by scanning of said electron beam, for each individual single line scanned by the electron beam on the sample is a predetermined value or less based on one or more electric characteristics of said sample derived from said images;
scanning said sample in individual single lines by the electron beam based on the determined probe current and scan speed and
wherein a sample parallel edge intensity and a sample parallel to perpendicular edge intensity ratio is measured and the scanning line density is selected to be said predetermined value or less.

11. The sample observation method according to claim 10, further comprising:
steps which input information of said sample, determine whether an optimization procedure for a scanning strategy of said electron beam is necessary, provide candidate scanning method(s) to said sample upon determining the optimization procedure is necessary, acquire images of said sample with the candidate scanning method(s), wherein
at least one of the following information is derived from said images taken by said scanning electron microscope: (1) brightness of the image(s), (2) contrast of edge(s) of features of said sample, (3) uniformity of the brightness of said images, (4) uniformity of said contrast of said edge(s) in said image(s), and a signal-to-noise ratio of said image(s).

12. The sample observation method according to claim 10, wherein when the electric characteristics of said sample and/or the candidates of recommended scanning methods are stored, and
wherein said candidates of recommended scanning methods for said electron beam are read out when the information concerning to said sample is input, and said electron beam scans over said sample using said scanning method(s) automatically and acquires images.

13. The sample observation method according to claim 10, wherein a sequence of a plural spatially separated line positions on said sample scanned by said electron beam are controlled.

14. The sample observation method according to claim 10, wherein said electric characteristic further includes is a charging relaxation time constant of said sample calculated based on a temporal change of an intensity of secondary charged particles emitted from said sample by radiating the electron beam to said sample.

15. The sample observation method according to claim 10, wherein said predetermined value is of said scanning line density is $7.2 \times 10^{-19}$ (C/nm).

16. The sample observation method according to claim 10, wherein said predetermined value is of said scanning line density is $3.52 \times 10^{-19}$ (C/nm).

17. The sample observation method according to claim 10, wherein the scan speed is increased from a normal scan speed.

18. The sample observation method according to claim 10, wherein a focal point or an astigmatism correction amount is calculated and the calculated result is fed back to a charged particle optical system.

19. A scanning electron microscope which forms an image of a scanned region by scanning a two-dimensional region on a sample with an electron beam, comprising:
a GUI;
sample information input means which inputs information relating to a sample; and
display means which displays candidates of recommended scanning methods based on the input sample information using said GUI, and displays images of said sample using said candidates of recommended scanning methods,
wherein the scanning electron microscope suppresses a number of injected electrons injected on said sample by said electron beam per individual single line scanned in a direction of said scanning by determining a probe current and a scan speed of scanning said individual single lines by said electron beam such that a scanning line density, which is a charge amount injected per unit of length on the sample by scanning of said electron beam, for each individual single line scanned by the electron beam on said sample is a predetermined value or less based on one or more electric characteristics of said sample derived from said images,
wherein said sample is scanned in individual single lines by the electron beam based on the determined probe current and scan speed, and
wherein a sample parallel edge intensity and a sample parallel to perpendicular edge intensity ratio is measured and the scanning line density is selected to be said predetermined value or less.

20. The scanning electron microscope according to claim 19, further comprising:
means which inputs information of said sample, determines whether an optimization procedure for a scanning strategy of said electron beam is necessary, provides candidate scanning method(s) to said samples upon determining the optimization procedure is necessary, acquires images of said sample with the candidate scanning method(s), wherein
at least one of the following information is derived from said images taken by said scanning electron microscope: (1)brightness of the images(s), (2) contrast of edge(s) of features of said sample, (3) uniformity of the brightness of said images (4) uniformity of said contrast of said edge(s) in said image(s), and a signal-to-noise ratio of said image(s).

21. The scanning electron microscope according to claim 19, wherein when the electric characteristics of said sample and/or the candidates of recommended scanning methods are stored, and
wherein said candidates of recommended scanning methods for said electron beam are read out when the information concerning to said sample is input, and said electron beam scans over said sample using said scanning method(s) automatically and acquires images.

22. The scanning electron microscope according to claim 19, wherein a sequence of plural spatially separated line positions on said sample scanned by said electron beam are controlled.

23. The scanning electron microscope according to claim 19, wherein said electric characteristic further includes a charging relaxation time constant of said sample calculated based on the a temporal change of an intensity of secondary charged particles emitted from said sample by radiating the electron beam to said sample.

24. The scanning electron microscope according to claim 19, wherein said predetermined value is of said scanning line density is $7.2 \times 10^{-19}$ (C/nm).

25. The scanning electron microscope according to claim 19, wherein said predetermined value is of said scanning line density is $3.52 \times 10^{-19}$ (C/nm).

26. The scanning electron microscope according to claim 19, wherein the scan speed is increased from a normal scan speed.

27. The scanning electron microscope according to claim 19, wherein a focal point or an astigmatism correction amount is calculated and the calculated result is fed back to a charged particle optical system.

28. A sample observation method, comprising:
a step of inputting sample information input means which inputs information relating to the sample; and
a step of displaying candidates of recommended scanning methods based on the input the sample information input means using said GUI;
a step of acquiring images of said sample using said candidates of recommended scanning methods; and
a step of suppressing a number of injected electrons injected on said sample by said electron beam per individual single line scanned in a direction of said scanning by determining a probe current and a scan speed of scanning said individual single lines by said electron beam such that a scanning line density, which is a charge amount injected per unit of length on the sample by scanning of said electron beam, for each individual single line scanned by the electron beam on said sample is a predetermined value or less based on one or more electric characteristics of said sample derived from said images; and
a step of measuring a sample parallel edge intensity and a sample parallel to perpendicular edge intensity ratio and selecting a scanning line density to be said predetermined value or less.

29. The sample observation method according to claim 28, further comprising:
steps which input information of said sample, determine whether an optimization procedure for the scanning strategy of said electron beam is necessary, provide candidate scanning method(s) to said sample upon determining the optimization procedure is necessary, acquire images of said sample with the candidate scanning method(s), wherein
at least one of the following information is derived from said images taken by said scanning electron microscope: (1) brightness of the image(s), (2) contrast of edge(s) of features of said sample, (3) uniformity of the brightness of said images, (4) uniformity of said contrast of said edge(s) in said image(s), and a signal-to-noise ratio of said image(s).

30. The sample observation method according to claim 28, wherein when the electric characteristics of said sample and/or the candidates of recommended scanning methods are stored, and
wherein said candidates of recommended scanning methods for said electron beam are read out when the information concerning to said sample is input, and said electron beam scans over said sample using said scanning methods automatically and acquires images.

31. The sample observation method according to claim 28, wherein a sequence of plural spatially separated line positions on said sample scanned by said electron beam are controlled.

32. The sample observation method according to claim 28, wherein said electric characteristic further includes a charging relaxation time constant of said sample calculated based on a temporal change of an intensity of secondary charged particles emitted from said sample by radiating the electron beam to said sample.

33. The sample observation method according to claim 28, wherein said predetermined value is of said scanning line density is $7.2 \times 10^{-19}$ (C/nm).

34. The sample observation method according to claim 28, wherein said predetermined value is of said scanning line density is $3.2 \times 10^{-19}$ (C/nm).

35. The sample observation method according to claim 28, wherein the scan speed is increased from a normal scan speed.

36. The sample observation method according to claim 28, wherein a focal point or an astigmatism correction amount is calculated and the calculated result is fed back to a charged particle optical system.

37. The scanning electron microscope according to claim 1,
wherein the probe current and the scan speed is controlled so that the probe current divided by the scan speed is suppressed to a certain magnitude.

* * * * *